United States Patent
Charles

(10) Patent No.: US 10,923,620 B2
(45) Date of Patent: *Feb. 16, 2021

(54) METHOD OF MANUFACTURING OF A GAN LIGHT EMITTING DIODE

(71) Applicant: Commissariat A L'Energie Atomique et aux Energies Alternatives, Paris (FR)

(72) Inventor: Matthew Charles, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/424,749

(22) Filed: May 29, 2019

(65) Prior Publication Data

US 2019/0371963 A1    Dec. 5, 2019

(30) Foreign Application Priority Data

May 29, 2018   (FR) ..................................... 18 54602

(51) Int. Cl.
*H01L 33/00*    (2010.01)
*C30B 25/02*    (2006.01)
(Continued)

(52) U.S. Cl.
CPC .......... *H01L 33/0075* (2013.01); *C30B 25/02* (2013.01); *C30B 29/406* (2013.01);
(Continued)

(58) Field of Classification Search
CPC . H01L 33/0075; H01L 33/06; H01L 33/0025; H01L 33/007; H01L 33/025;
(Continued)

(56) References Cited

U.S. PATENT DOCUMENTS

2012/0015502 A1   1/2012   Cui et al.
2018/0277715 A1*  9/2018   Ma ...................... H01L 33/0025
(Continued)

FOREIGN PATENT DOCUMENTS

WO    WO 02/093658 A1    11/2002

OTHER PUBLICATIONS

French Preliminary Search Report dated Mar. 4, 2019 in French Application 18 54602, filed on May 29, 2018 (with English Translation of Categories of Cited Documents & Written Opinion).

*Primary Examiner* — Ahmed N Sefer
(74) *Attorney, Agent, or Firm* — Oblon, McClelland, Maier & Neustadt, L.L.P.

(57) ABSTRACT

A method for manufacturing a light-emitting diode is provided, including the following steps in succession, while maintaining a substrate in a vapour-phase epitaxial growth chamber: epitaxial deposition, with an atmosphere having a first non-zero concentration of ammonia in the chamber, of a first GaN alloy layer P-doped with magnesium; epitaxial deposition, on the first GaN alloy layer, of a sacrificial GaN alloy layer in a second atmosphere in the chamber that is not supplied with magnesium; placing the second atmosphere inside the chamber under conditions with a second concentration of ammonia that is at least equal to a third of the first non-zero concentration so as to remove the sacrificial GaN layer; and then epitaxial deposition of a second N-type doped GaN alloy layer so as to form a tunnel junction with the first GaN alloy layer.

15 Claims, 4 Drawing Sheets

(51) Int. Cl.
*C30B 29/40* (2006.01)
*H01L 33/06* (2010.01)
*H01L 33/04* (2010.01)
*H01L 21/02* (2006.01)
*H01L 33/02* (2010.01)

(52) U.S. Cl.
CPC ...... *H01L 21/0251* (2013.01); *H01L 21/0254* (2013.01); *H01L 21/0262* (2013.01); *H01L 21/02507* (2013.01); *H01L 33/007* (2013.01); *H01L 33/0025* (2013.01); *H01L 33/025* (2013.01); *H01L 33/04* (2013.01); *H01L 33/06* (2013.01)

(58) Field of Classification Search
CPC ................. H01L 33/04; H01L 21/0251; H01L 21/02458; H01L 21/0254; H01L 21/02579; H01L 21/0262; H01L 21/02507; C30B 29/406; C30B 25/02
See application file for complete search history.

(56) References Cited

U.S. PATENT DOCUMENTS

2018/0374699 A1* 12/2018 Yonkee ............. H01L 21/02389
2019/0140134 A1*  5/2019 Mann ................. H01L 21/0262
2019/0207043 A1*  7/2019 Yonkee ............. H01L 31/03044

* cited by examiner

METHOD OF MANUFACTURING OF A GAN LIGHT EMITTING DIODE

The invention relates to GaN type light-emitting diodes and in particular to the methods for manufacturing such light-emitting diodes.

The manufacture of light-emitting diodes including GaN alloy layers involves doping some of these layers with P-type dopants. P-type doping is relatively difficult to carry out as the acceptor levels are deep. Thus, the proportion of ionization of the P-type dopant at ambient temperature remains relatively low. Due to its relatively low ionization energy, magnesium is frequently used as P-type dopant for the GaN alloy layers. The solubility of the magnesium in GaN alloys nevertheless remains low. Thus, when overlaying a P-doped GaN alloy layer and a GaN layer without intentional magnesium doping, magnesium is found in this last GaN layer, called NID. Since the reduction in the concentration of magnesium in the NID GaN alloy layer, from its interface with the pGaN alloy layer, is relatively slow, a significant concentration of magnesium can be observed on a thickness of approximately 100 nm of the NID GaN alloy layer.

In order to manufacture GaN type light-emitting diodes, a stack of layers is produced, with the last functional layer deposited during the manufacturing method generally being a pGaN alloy layer using the magnesium as dopant. A contact electrode then must be formed on the upper face of this stack. For this structure, the reduction of the concentration of magnesium is not restrictive. However, in order to improve the contact resistance on the upper face of the stack, a method described in publication 'µLEDs with tunnel junction by MBE and MOCVD+MBE', published in 2015 in Applied Physics Letters, 107, 051107, uses an nGaN alloy layer on the pGaN alloy layer to form a tunnel junction.

When the nGaN and pGaN alloy layers are formed by MOCVD epitaxy steps, the nGaN alloy layer has significant concentration of magnesium. The tunnel junction then becomes inoperative.

The aim of the invention is to overcome one or more of these disadvantages. The invention thus relates to a method for manufacturing a light-emitting diode, as defined in the accompanying claims.

The invention also relates to the variations of the dependent claims. A person skilled in the art will understand that each of the features of the variations of the description or of the dependent claims can be combined independently of the features of an independent claim, yet without forming an intermediate generalization.

Further features and advantages of the invention will become clearly apparent from the following description, which is provided by way of a non-limiting example, with reference to the accompanying drawings, in which.

Figure 1:
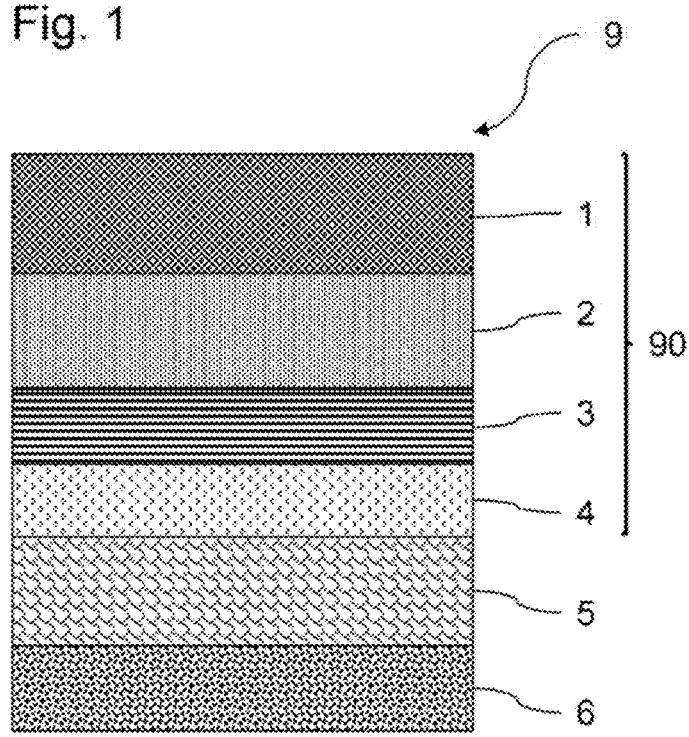
FIG. 1 is a schematic section view of a multilayer structure produced using a manufacturing method according to the invention.

FIG. 1 is a schematic transverse section view of a multilayer structure 9, produced using a manufacturing method according to the invention. The multilayer structure 9 comprises a light-emitting diode 90, formed on a buffer layer 5. The buffer layer 5 is fixed on a substrate 6.

In this case, the light-emitting diode 90 includes:
an N-doped AlGaN layer 4, formed on the buffer layer 5;
a multiple quantum well layer 3, formed on the layer 4;
a P-doped AlGaN layer 2, formed on the layer 3;
an N-doped AlGaN layer 1, formed on the layer 2.

Combining layers 1 and 2 forms a tunnel junction. A suitable combination of materials of the layers 1 and 2 for forming a tunnel junction is per se known to a person skilled in the art. The upper face of the layer 1 is intended to form a contact interface for an electrode, not shown. The light-emitting diode 9 is of the GaN type, with emission in the visible or ultraviolet spectrum.

The substrate 6 has a structure that is per se known. The substrate 6 can be an insulator or an intrinsic or doped silicon type semiconductor or SiC, sapphire or even AlN or GaN. The substrate 6 typically can be approximately 350 µm to 1.5 mm thick and have a diameter of approximately 10 mm to 300 mm.

An adaptation layer, not shown, can be interposed between the substrate 6 and the buffer layer 5. The buffer layer 5 is, for example, made of non-intentionally doped GaN.

The AlGaN layer 4 has N-doping, with, for example, a concentration of silicon or germanium that is typically between $1*10^{17}$ cm$^{-3}$ and $1*10^{19}$ cm$^{-3}$.

The multiple quantum well layer 3 has a structure that is per se known, with, for example, several alternations of a stack of GaN and InGaN layers or of AlGaN/GaN layers or even of $Al_xGa_{(1-x)}N/Al_yGa_{(1-y)}N$ layers, where x≠y.

The P-doped AlGaN layer 2 can, for example, have, in a manner per se known, a thickness that is typically between 50 nm and 400 nm and a chemical concentration of magnesium that is typically between $1*10^{18}$ cm$^{-3}$ and $1*10^{20}$ cm$^{-3}$. The P-doped doping in this case is obtained by ionization of magnesium introduced into the AlGaN of the layer 2. The layer 2 also can be produced from any other GaN alloy.

The N-doped AlGaN layer 1 can, for example, have, in a manner per se known, a thickness that is typically between 20 and 200 nm and an N-dopant concentration that is typically between $1*10^{18}$ cm$^{-3}$ and $1*10^{20}$ cm$^{-3}$. The concentration of the dopant can be greater next to the junction and lower towards the surface. The layer 2 also can be produced from any other GaN alloy, for example, from an InGaN alloy.

It is important to prevent the magnesium, which is difficult to integrate into the layer 2, from entering the layer 1, with this magnesium then making it difficult to form a tunnel junction.

FIGS. 2 to 6 are schematic section views showing various steps of a manufacturing method according to one embodiment of the invention.

Figure 2:
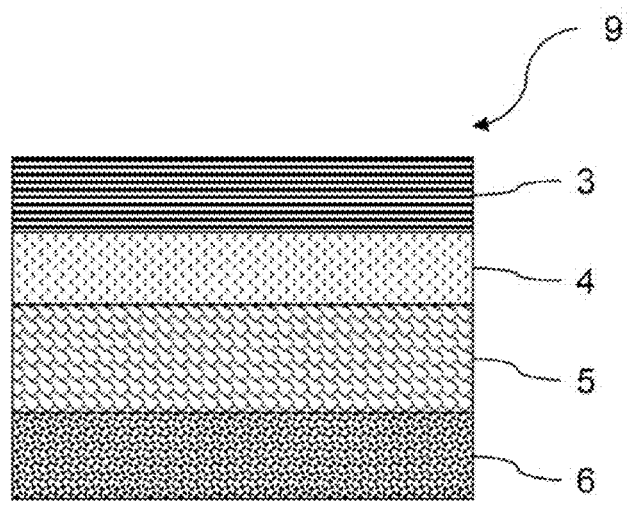
FIGS. 2 to 6 are schematic section views of various steps of a manufacturing method according to one embodiment of the invention.

FIG. 2 shows a multilayer structure 9 during formation, provided with a substrate 6 overlaid with a buffer layer 5, an AlGaN layer 4 and a multiple quantum well layer 3, as previously described and that can be obtained by methods that are per se known.

Figure 3:
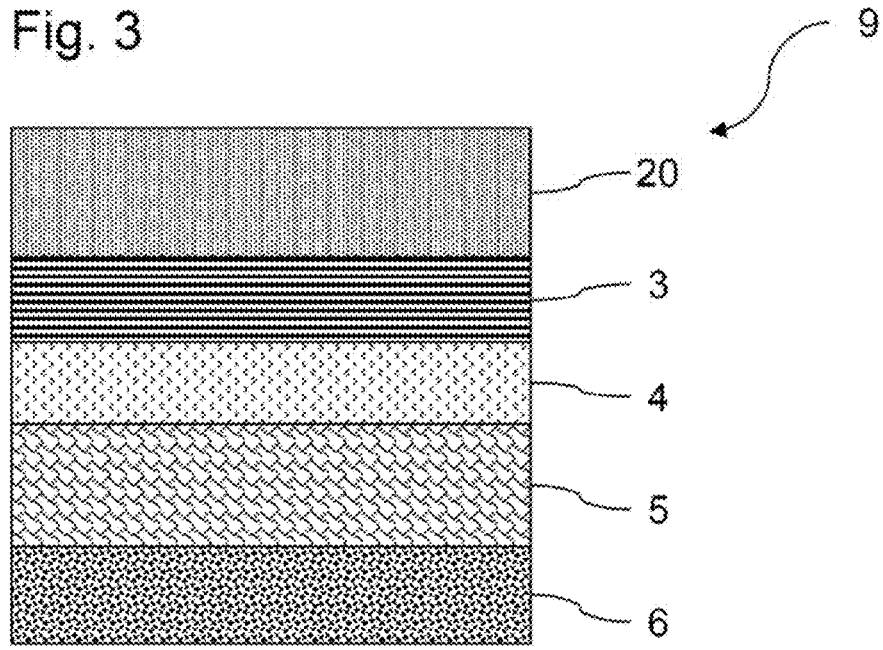

FIG. 3 shows the deposition of a pAlGaN layer 20, according to parameters that are per se known. For example, by placing the structure 9 in a vapour-phase epitaxial growth chamber (not shown), a gaseous atmosphere is created in the chamber, with a mixture including precursors of gallium (for example, TMGa), aluminium (for example, TMAl), magnesium (for example, Cp$_2$Mg), ammonia, hydrogen and nitrogen. The partial ammonia pressure in the mixture is typically between 2000 and 8000 Pa for this step. The concentration of a gas in the atmosphere inside the chamber can be expressed as the ratio of the partial pressure of this gas to the total pressure in the chamber. The partial pressure of magnesium is set to a level that allows the desired concentration of magnesium to be obtained for the layer 2. For example, it is possible to target an average chemical concentration of magnesium that is at least equal to $1*10^{19}$ cm$^{-3}$, and even at least equal to $1*10^{20}$ cm$^{-3}$ in the layer 2. The temperature in the chamber for producing the epitaxial growth of the layer 20 is, for example, 1000° C. The deposition of the pAlGaN layer 20 advantageously can be carried out with a thickness that is between 50 and 400 nm.

Figure 4:
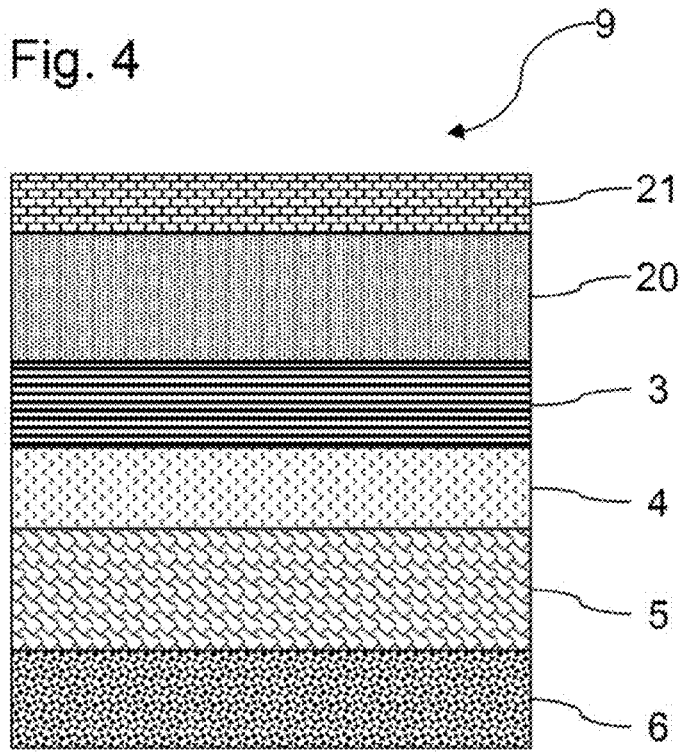

FIG. 4 shows another step of the manufacturing method according to the embodiment. By maintaining the structure 9 in the vapour-phase epitaxial growth chamber, the gaseous atmosphere in the chamber is modified by removing the supply of magnesium from the atmosphere of the chamber. The chamber is thus maintained in an epitaxial growth gaseous atmosphere with a mixture including gallium, ammonia, dihydrogen and nitrogen. A GaN layer 21 is thus subsequently deposited on the pAlGaN layer 20, with conditions for forming a GaN layer of the non-intentionally doped type.

The partial ammonia pressure in the mixture for depositing the layer 21 is typically between 4000 and 15,000 Pa for this step. The temperature in the chamber for producing the epitaxial growth of the layer 21 is 1050° C., for example. The deposition of the GaN layer 21 advantageously can be carried out on a thickness that is between 50 and 200 nm. Due to the memory effect of the magnesium used when depositing the layer 20, the layer 21 also includes magnesium. The concentration of magnesium decreases in the layer 21 incrementally when moving away from its interface with the layer 20.

Figure 5:
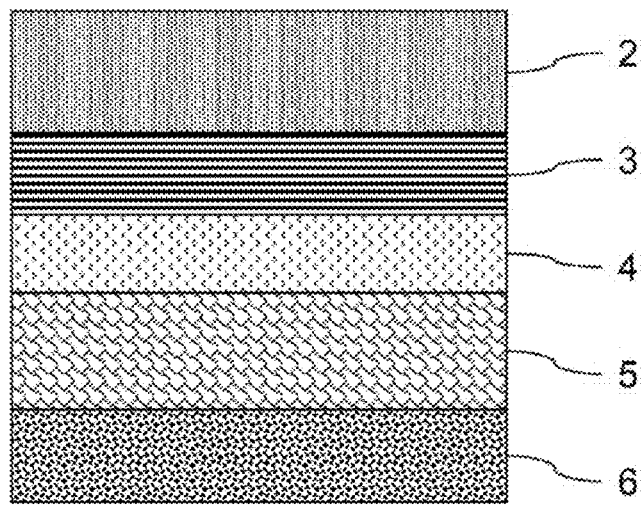

In order to obtain the configuration shown in FIG. 5, the multilayer structure 9 is maintained in the epitaxial growth chamber. The atmosphere inside the chamber is then placed under conditions for removing the layer 21 and/or the upper part of the layer 20.

According to a first solution, the atmosphere inside the chamber for this removal step in this case exhibits a concentration of ammonia Cg1 that is at most equal to a third of the concentration of ammonia Cd1 of the atmosphere when depositing the layer 20. Advantageously, the concentration Cg1 is at most equal to 10% of the concentration Cd1. The removal step in this case comprises the removal of the entire layer 21. The removal is carried out by a desorption mechanism of the layer 21.

Advantageously, the concentration of ammonia Cg1 in the atmosphere during this removal step is non-zero, in order to stabilize the etching/removal process. The concentration of ammonia Cg1 in the atmosphere inside the chamber for this removal step can be, for example, at least equal to 4% of the concentration Cd1 and can be, for example, equal to 5% of the concentration Cd1.

The removal of the upper part of the precursor layer is advantageously implemented on a thickness that is at least equal to 20 nm, in order to promote the reduction front of the concentration of magnesium.

The atmosphere used to implement this removal step also comprises dihydrogen and this removal is implemented at a temperature of 1050° C. Under such removal conditions, an etching speed of 2 μm/h has been obtained for the layer 21, with a concentration of ammonia Cg1 of 5% of the concentration Cd1 or a partial ammonia pressure between 200 and 300 Pa.

According to a second solution, the atmosphere inside the chamber for this removal step in this case exhibits a zero concentration of ammonia. The removal step in this case comprises the removal of the entire layer 21. The removal is carried out by a desorption mechanism of the layer 21.

The removal of the upper part of the precursor layer is advantageously implemented on a thickness that is at least equal to 20 nm, in order to promote the reduction front of the concentration of magnesium.

The atmosphere used to implement this removal step comprises dihydrogen and this removal is implemented at a temperature of 1050° C. Under such removal conditions, an etching speed of 12 μm/h has been obtained for the layer 21.

The layer 20 is either used as a stop layer following the etching of the layer 21 (the layer 20 being made of AlGaN, whereas the layer 21 is made of GaN) or undergoes additional etching while maintaining the removal conditions. The layer 2 is then obtained from the layer 20, as shown in FIG. 5. When the layer 21 is made of GaN, then the layer 20 is made of AlGaN, this layer 20 naturally forming a stop layer for the conditions for etching the layer 21 in the epitaxial chamber. The use of the layer 20 as a stop layer allows any dispersions of the manufacturing method to be limited, whilst ensuring proper control of the step of etching the layer 21. However, producing the layer 21 from AlGaN also can be contemplated. It has already been noted that the layer 20 also can be GaN, without forming a stop layer.

Figure 6:
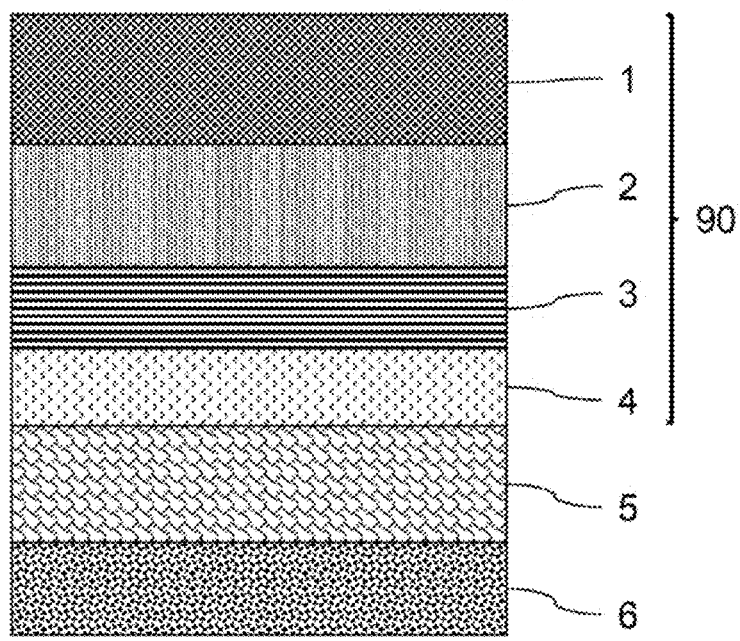

FIG. 6 shows the deposition of a layer 1 on the layer 2. In the example shown, epitaxial deposition of the N-doped AlGaN layer 1 has been implemented on the layer 2. The layer 1 can undergo a step of mecano-polishing after it is deposited.

Additional steps of a method for manufacturing a light-emitting diode will not be described in further detail (formation of an electrode on the layer 1, in the form of electrode patterns as pixels, for example, or formation of a polarization contact of the layer 4, for example), since these steps are per se known to a person skilled in the art.

By way of a variation, depositing an InGaN layer between the layer 2 and the layer 1 (on a thickness that is between 2 and 5 nm, for example) also can be contemplated with a view to improving the performance of the tunnel junction.

Varying the concentration of aluminium in the thickness of the layer 1 or of the layer 2 also can be contemplated with a view to promoting doping with polarization.

During epitaxial growth of the layer 20, the magnesium can be passivated by hydrogen originating from the ammonia. The presence of the layer 1 can complicate the removal of the hydrogen. Depassivation annealing can be carried out following the removal of the sacrificial layer 21. Nitrogen is then used as a carrier gas, for example, with hydrazine (or any other molecule that does not generate hydrogen) as nitrogen precursor, in order to avoid the incorporation of hydrogen, and the passivation of the magnesium.

Figure 7:
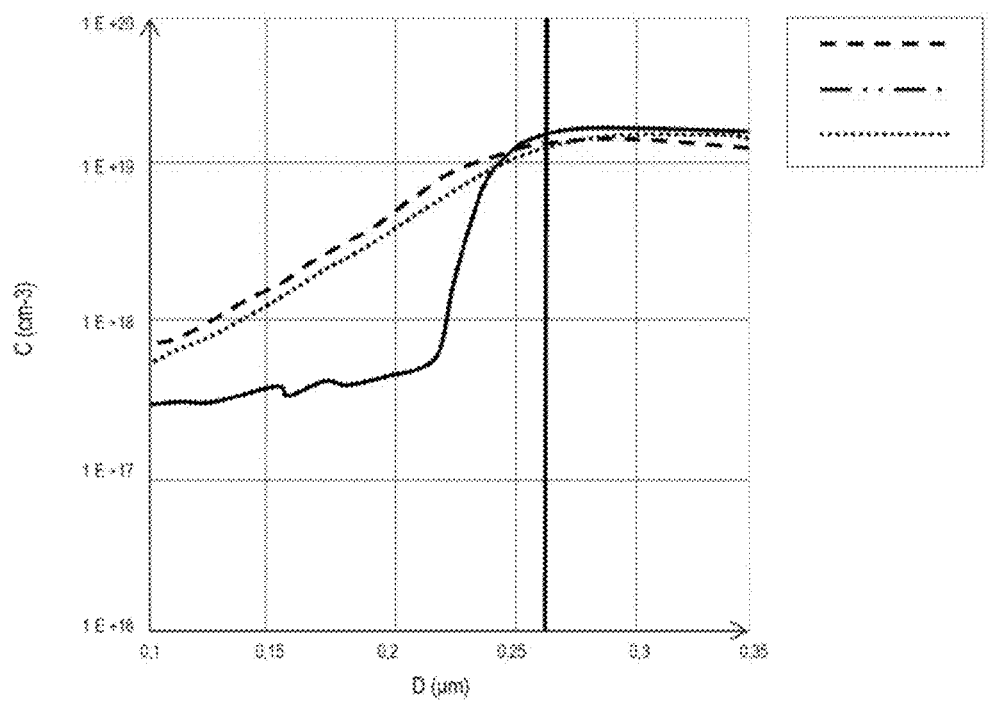
FIG. 7 is a comparative diagram of the concentration of magnesium in the thickness of a multilayer structure, as a function of its manufacturing method.

FIG. 7 is a comparative diagram of the concentration of magnesium C as a function of the position D in the depth of a multilayer structure, and as a function of its manufacturing method. A zero depth D corresponds to the upper face of the layer 1 of the structure 9. A depth of 0.27 μm corresponds to the interface between the layer 1 and the layer 2.

The broken line curve corresponds to a structure produced according to a method of the prior art, in which a GaN layer 1 is epitaxially deposited immediately after the epitaxial deposition of a pGaN layer 2. The dotted line curve corresponds to a structure produced according to a method of the prior art, in which 5 minutes of annealing is implemented between the deposition of a pGaN layer 2 and the deposition of a GaN layer 1, while removing the gallium (TMGa) from the atmosphere of the chamber during this annealing process. The solid line curve corresponds to a structure 1 obtained with a manufacturing method according to the embodiment of the invention.

It is to be noted that, on the one hand, a GaN layer 1 thickness of at least 100 nm is necessary for a method according to the prior art, in order to reduce the concentration of magnesium by ten relative to its interface with the layer 2. Even with a method according to the prior art implementing an annealing step, such a GaN layer 1 thickness is necessary for reducing the concentration of magnesium by ten relative to the interface with the layer 2.

By contrast, it has been noted that the concentration of magnesium drops by ten with a GaN layer 1 thickness of approximately 30 nm for a structure 9 produced according to the embodiment of the invention.

The manufacturing method according to the invention thus allows the rate of reduction of the concentration of magnesium in the AlGaN layer 1 formed on the layer 2 to be increased. According to the invention, the rate of reduction of the concentration of magnesium in the AlGaN layer 1 formed on the layer 2 is therefore particularly sharp. Thus, the formation of a conductive electrode on the AlGaN layer 1 is facilitated, without altering the properties of the AlGaN layer 2. Such a result is also obtained without polluting the interface between the layers 1 and 2, due to the fact that the structure 9 is maintained in the epitaxial chamber. The manufacturing method is also relatively fast, due to the fact that the structure 9 is maintained in the epitaxial chamber during these various steps of the method.

This can prove to be particularly advantageous for a light-emitting diode with an emission spectrum that is basically located in the visible spectrum, but also can be applied to a light-emitting diode with an emission spectrum that is basically located in the ultraviolet spectrum.

In order to further increase the speed of reducing the concentration of magnesium above the layer 2, the method advantageously implements an alternation of steps of:
  partial removal of the layer 21;
  epitaxial growth of a GaN layer with conditions for forming a layer of the non-intentionally doped type.

For example, implementing at least ten alternations of such steps can be contemplated.

The step of removing the layer 21 in this case is advantageously implemented whilst maintaining a certain concentration of ammonia in the atmosphere of the chamber. Such removal allows a removal speed to be obtained that is both fast enough for quickly implementing an industrial process and slow enough for properly controlling the removal process. Furthermore, such removal can be carried out under the same temperature conditions as for the deposition of the layer 20, which avoids any need for prior cooling of the structure.

However, implementing a removal process with other atmospheres in the chamber also can be contemplated, on completion of the epitaxial deposition of the layer 20. For example, $Cl_2$ or HCl can be introduced into the chamber for implementing the removal step. The use of $Cl_2$ has the particular advantage of allowing etching at a lower temperature, between 500° C. and 800° C., which is of interest for LEDs emitting visible light, with quantum wells containing indium, which would not be stable if a thermal budget at 1050° C. was used.

According to another independent aspect of the invention, the step of forming the layer 20 (precursor of the layer 2) can be implemented so that the concentration of magnesium in the bottom of this layer 20 is very sharp. With such a sharp front, an even thinner layer 2 can be used.

To this end, the step of depositing the pAlGaN precursor layer 20 described with reference to FIG. 3 can be implemented as follows. When the multilayer structure 9 is disposed in the vapour-phase epitaxial growth chamber, the surface of the layer is previously saturated with magnesium, before the epitaxial growth conditions of the pAlGaN precursor layer are established. Adding the magnesium precursor to the chamber to achieve the magnesium saturation of the surface advantageously can be carried out over a period that is at least equal to 10 seconds. Once the surface is saturated with magnesium, the deposition of the pAlGaN layer 20 is initiated with epitaxial growth conditions as described with reference to FIG. 3. The saturation is carried out by sending the magnesium precursor without sending the gallium precursor, or with a very small amount of gallium precursor.

Figure 8:
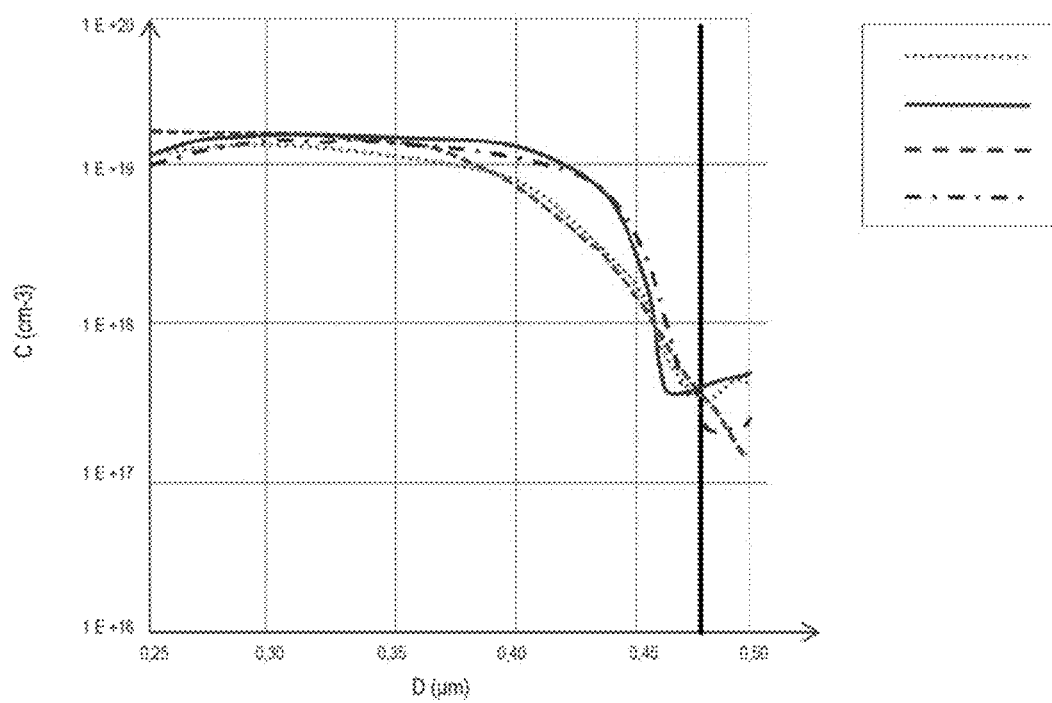
FIG. 8 is a comparative diagram of the concentration of magnesium in the thickness of a multilayer structure, as a function of variations of manufacturing methods according to another aspect of the invention.

FIG. 8 shows a comparative diagram of the concentration of magnesium in the thickness of the pAlGaN layer 2 as a function of the period for maintaining magnesium in the atmosphere, prior to epitaxial deposition of the pAlGaN layer. The vertical line corresponds to the bottom of the layer 2. The broken line curve corresponds to a manufacturing method, in which the atmosphere of the epitaxial chamber is not maintained with magnesium before the epitaxial deposition of the pAlGaN layer. The dotted curve corresponds to a manufacturing method, in which magnesium is maintained in the atmosphere of the epitaxial chamber for a 30 second period before the epitaxial deposition of the pAlGaN layer. The dot-and-dash curve corresponds to a manufacturing method, in which magnesium is maintained in the atmosphere of the epitaxial chamber for a 90 second period before the epitaxial deposition of the pAlGaN layer. The solid line curve corresponds to a manufacturing method, in which magnesium is maintained in the atmosphere of the epitaxial chamber for a 120 second period before the epitaxial deposition of the pAlGaN layer. It has been noted that the longer that magnesium is maintained in the atmosphere before returning to the epitaxy conditions, the sharper the front of concentration of magnesium at the bottom of the layer 2.

The invention proves to be particularly advantageous for a structure 9 intended to form matrices of pixels of light-emitting diodes, since the method for manufacturing these components imposes constraints with respect to the choice of metallization for the contacts, and therefore the tunnel junction allows different metals to be used whilst maintaining good contact.

The invention claimed is:

1. A method for manufacturing a light-emitting diode, comprising the following steps in succession, while maintaining a substrate in a vapour-phase epitaxial growth chamber:
  epitaxial deposition, with an atmosphere having a first non-zero concentration of ammonia in the vapour-phase epitaxial growth chamber, of a first GaN alloy layer P-doped with magnesium;
  epitaxial deposition, on the first GaN alloy layer, of a sacrificial GaN alloy layer in a second atmosphere in the vapour-phase epitaxial growth chamber that is not supplied with magnesium;
  placing the second atmosphere inside the vapour-phase epitaxial growth chamber under conditions with a second concentration of ammonia that is at least equal to a third of the first non-zero concentration so as to remove the sacrificial GaN layer; and then
    epitaxial deposition of a second N-type doped GaN alloy layer so as to form a tunnel junction with the first GaN alloy layer.

2. The method according to claim 1, wherein an alloy of the first GaN alloy layer is AlGaN.

3. The method according to claim 2, wherein the first GaN alloy layer has an aluminium concentration gradient in a thickness thereof.

4. The method according to claim 1, wherein a thickness of the first GaN alloy layer is between 50 nm and 400 nm.

5. The method according to claim 1, wherein an alloy of the sacrificial GaN alloy layer is different from an alloy of the first GaN alloy layer.

6. The method according to claim 1, wherein an alloy of the second N-type doped GaN alloy layer is AlGaN.

7. The method according to claim 1,
    wherein the substrate maintained in the vapour-phase epitaxial growth chamber is overlaid with a multiple quantum well layer, and
    wherein the first GaN alloy layer is deposited on the multiple quantum well layer.

8. The method according to claim 1, further comprising a step of depositing a conductive electrode on the second N-type doped GaN alloy layer.

9. The method according to claim 1, further comprising a step of depositing an InGaN layer on the first GaN alloy layer, the second N-type doped GaN alloy being deposited on the InGaN layer.

10. The method according to claim 1, wherein a partial ammonia pressure at least equal to 200 Pa is maintained in the vapour-phase epitaxial growth chamber during the removal of the sacrificial GaN alloy layer.

11. The method according to claim 1, wherein the removal of the sacrificial GaN alloy layer is carried out with an atmosphere comprising dihydrogen in the vapour-phase epitaxial growth chamber.

12. The method according claim 1, wherein the removal of the sacrificial GaN alloy layer is cared out with an atmosphere that contains $Cl_2$ or HCl in the vapour-phase epitaxial growth chamber.

13. The method according to claim 1, wherein the step of epitaxial deposition of the first GaN alloy layer is preceded by a step of saturation, in magnesium dopant, of a surface on which the first GaN alloy layer is to be deposited.

14. The method according to claim 1, wherein the removal of the sacrificial GaN alloy layer removes a thickness of at least 20 nm from the sacrificial GaN alloy layer.

15. The method according to claim 1, wherein the removal of the sacrificial GaN alloy layer is continued until the first GaN alloy layer is revealed.

\* \* \* \* \*